(12) United States Patent
McEvoy et al.

(10) Patent No.: US 7,580,558 B2
(45) Date of Patent: Aug. 25, 2009

(54) SCREEN PRINTING APPARATUS

(75) Inventors: Ian Patrick McEvoy, Bath (GB); Frank Norman Squibb, Dorset (GB)

(73) Assignee: DEK International GmbH, Zurich (CH)

( * ) Notice: Subject to any disclaimer, the term of this patent is extended or adjusted under 35 U.S.C. 154(b) by 651 days.

(21) Appl. No.: 10/483,664

(22) PCT Filed: Jul. 10, 2002

(86) PCT No.: PCT/GB02/03175

§ 371 (c)(1),
(2), (4) Date: Oct. 7, 2004

(87) PCT Pub. No.: WO03/006243

PCT Pub. Date: Jan. 23, 2003

(65) Prior Publication Data

US 2005/0041851 A1 Feb. 24, 2005

(30) Foreign Application Priority Data

Jul. 13, 2001 (GB) .................................. 0117099.2

(51) Int. Cl.
*G06K 9/00* (2006.01)
*G06K 9/32* (2006.01)
*H04N 7/18* (2006.01)
(52) U.S. Cl. ........................ 382/151; 382/144; 382/147; 382/152; 382/294; 348/125
(58) Field of Classification Search ................. 382/151, 382/287
See application file for complete search history.

(56) References Cited

U.S. PATENT DOCUMENTS

| | | | |
|---|---|---|---|
| 4,864,361 A * | 9/1989 | Amao et al. ................... | 355/53 |
| 5,901,646 A * | 5/1999 | Walker et al. ................ | 101/123 |
| 5,943,089 A | 8/1999 | Douglas ....................... | 348/87 |
| 6,031,931 A * | 2/2000 | Chiu et al. ................... | 382/141 |
| 6,352,025 B1 * | 3/2002 | Neiconi et al. .............. | 101/126 |
| 6,634,290 B1 * | 10/2003 | Shimizu et al. ............. | 101/129 |

FOREIGN PATENT DOCUMENTS

| | | |
|---|---|---|
| DE | 3904863 | 8/1990 |
| GB | 2 239 427 | 3/1991 |
| GB | 2 260 729 | 4/1993 |
| GB | 2 351 258 | 12/2000 |
| JP | 05302952 | 11/1993 |
| JP | 2000255028 | 9/2000 |

* cited by examiner

*Primary Examiner*—Brian P Werner
*Assistant Examiner*—Jose M Torres
(74) *Attorney, Agent, or Firm*—Renner, Otto, Boisselle & Sklar, LLP

(57) ABSTRACT

A screen printing apparatus and method for printing deposits of material onto a workpiece, the apparatus comprising an inspection station for determining a positional relationship of features on upper and lower surfaces of the workpiece. The inspection station comprises an imaging system for determining a positional relationship of features on upper and lower surfaces of the workpiece. The imaging system comprises at least two spaced imaging units for imaging features on an upper surface of the workpiece and at least two spaced imaging units for imaging features on a lower surface of the workpiece. A processing unit determines a positional relationship of the imaged features on the upper and lower surfaces of the workpiece. A printing station prints deposits of material onto the workpiece. Also described are a transport mechanism and an alignment system.

32 Claims, 3 Drawing Sheets

SCREEN PRINTING APPARATUS

This application is a national phase of International Application No. PCT/GB02/03175 filed Jul. 10, 2002 and published in the English language.

BACKGROUND OF THE INVENTION (1) Field of the Invention

The present invention relates to an inspection station and a printing station, in particular for a screen printing apparatus, a screen printing apparatus incorporating the same, and a method of screen printing deposits of material onto workpieces, in particular substrates, through a printing screen, often referred to as a stencil.

The present invention finds particular application in the electronics field in printing deposits of solder paste onto printed circuit boards prior to the subsequent placement of electronic components.

(2) Description of the Related Art

In printing material onto workpieces, particularly solder paste onto contact pads of a printed circuit board, it is important to accurately align the workpiece with the printing screen through which material is to be deposited.

Existing screen printing apparatus include an imaging system which utilizes video camera units and image processing software to determine any misalignment of a workpiece and the printing screen, and hence the relative positional correction of the workpiece and the printing screen which is required to accurately align the workpiece with the printing screen prior to printing material onto the workpiece. In such an imaging system, the camera units are introduced between the workpiece and the printing screen to image features at at least two widely-spaced positions on both the workpiece and the printing screen. From this image data, the misalignment can be determined, and the workpiece moved relative to the printing screen in order to correctly align the workpiece and the printing screen.

Although such an imaging system functions perfectly satisfactorily, this system does suffer from a number of disadvantages, particularly for the implementation of high-speed screen printing apparatus. Significantly, the cycle time of screen printing apparatus which utilizes such an imaging system is relatively long. There are time delays associated with introducing and withdrawing the camera units in acquiring the image data, and also with the requirement to close the necessarily large spacing between the workpiece and the printing screen to the required spacing for screen printing. In requiring the location of the camera units between the workpiece and the printing screen, the workpiece has necessarily to be spaced a large distance from the printing screen in order to be able to physically fit the camera units therebetween. This spacing is typically at least 80 mm. In addition, when single camera units are used to image features on the workpiece and the printing screen, there is a further time delay associated with moving the camera units to at least a second position and acquiring the image data at those positions. These time delays contribute to the cycle time and hence limit the throughput of the screen printing apparatus. Furthermore, misalignment can be re-introduced when closing the large spacing between the workpiece and the printing screen.

U.S. Pat. No. 5,943,089 discloses an alternative imaging system which is configured such as to be disposed beneath the printing screen and a workpiece to be printed, and thereby image features on lower surfaces of the printing screen and the workpiece. This imaging system avoids the need for the introduction and withdrawal of camera units from between the printing screen and the workpiece in acquiring the image data, and, as such, does not require a large spacing between the workpiece and the printing screen.

BRIEF SUMMARY OF THE INVENTION

The present inventors have recognized that such an imaging system requires that the features to be imaged on one, lower surface of the workpiece have necessarily to have a predetermined registration with elements on the other, upper surface of the workpiece, and that the registration has to be sufficiently accurate as to enable deposits of material to be printed with a required positional accuracy on the upper surface of the workpiece. For some applications, the accuracy of the registration need not be that precise. However, for other applications, the accuracy of the registration has to be very precise, particularly with the use of smaller scale components and higher component densities. Such registration would require the fabrication of workpieces, typically substrates, such as printed circuit boards, to much smaller tolerances than currently required. Such tolerance requirements would significantly increase the manufacturing complexity, and be for no reason other than to provide for the precise registration of features on one, lower surface of the workpiece to elements on the other, upper surface of the workpiece.

The present inventors have thus devised the present invention which allows for the accurate printing of deposits of material onto workpieces and does not require the fabrication of workpieces to any tighter tolerances than currently required, and, moreover, does not require features on one, lower surface of a workpiece to have a predetermined registration with elements on the other, upper surface of the workpiece. In the present invention, features on an upper surface of a workpiece to be printed, which have a predetermined and precise relationship to elements thereon, and features on the other, lower surface of the workpiece are both imaged and the positional relationship determined, such that the upper surface of the workpiece, and in particular the elements thereon, can be subsequently precisely positioned at a printing zone by reference only to features on the lower surface of the workpiece. Also, the present invention is particularly flexible in not requiring features on one, lower surface of a workpiece to have a predetermined registration with elements on the other, upper surface of the workpiece.

In this way, the present invention provides a screen printing apparatus for and method of screen printing which provide for shorter cycle times and the improved alignment of a workpiece and the printing screen.

In one aspect the present invention provides a screen printing apparatus for printing deposits of material onto a workpiece, comprising: an inspection station for determining a positional relationship of features on upper and lower surfaces of the workpiece, the inspection station comprising: an imaging system for determining a positional relationship of features on upper and lower surfaces of the workpiece, the imaging system comprising at least two spaced imaging units for imaging features on an upper surface of the workpiece, at least two spaced imaging units for imaging features on a lower surface of the workpiece, and a processing unit for determining a positional relationship of the imaged features on the upper and lower surfaces of the workpiece; and a printing station for printing deposits of material onto the workpiece, the printing station comprising: a workpiece support assembly comprising a workpiece support member for supporting the workpiece at a printing zone; a printing screen disposed above the workpiece support member; a transport mechanism for transporting the workpiece to the printing zone; and an alignment system for aligning the upper surface of the supported workpiece and the printing screen in relation to one another, the alignment system comprising at least two spaced workpiece imaging units for imaging features on a lower surface of the workpiece, and an alignment stage for moving the workpiece support member and the printing screen in relation to one another such as to align the upper surface of the workpiece and the printing screen in relation to one another by reference to positions of the imaged features on the lower surface of the workpiece as imaged at the printing zone and the positional relationship of the imaged features on the upper and lower surfaces of the workpiece as determined at the inspection zone.

Preferably, the workpiece support member includes at least one recess for receiving at least one component on the lower surface of the workpiece.

Preferably, the workpiece support member comprises a support plate on which the workpiece is in use supported.

Preferably, the workpiece support assembly further comprises a vertical stage for raising and lowering the workpiece support member and the printing screen in relation to one another.

More preferably, the vertical stage is operable to position the workpiece support member and the printing screen in relation to one another between a workpiece-receiving configuration in which the workpiece can be received above the workpiece support member, a workpiece-alignment configuration in which the supported workpiece can be aligned relative to the printing screen, and a workpiece-clamping configuration in which the workpiece is clamped.

More preferably, the vertical stage is configured to raise and lower the workpiece support member in relation to the printing screen.

Preferably, the alignment system further comprises at least two spaced screen imaging units for imaging features on a lower surface of the printing screen, and the alignment stage is configured to align the workpiece support member and the printing screen in relation to one another by reference to positions of the imaged features on the lower surface of the printing screen.

Preferably, the alignment stage is configured to move the workpiece support member in relation to the printing screen.

Preferably, the maximum spacing between the supported workpiece and the printing screen is less than about 20 mm.

More preferably, the spacing is less than about 10 mm.

Yet more preferably, the spacing is less than about 5 mm.

Still more preferably, the spacing is less than about 3 mm.

Yet still more preferably, the spacing is less than about 2 mm.

Preferably, the transport mechanism of the printing station comprises a belt feed unit.

More preferably, the belt feed unit of the transport mechanism of the printing station comprises first and second belt drives for engaging opposed lateral edges of the workpiece.

Yet more preferably, the belt drives are configured to engage a lower surface of the workpiece.

Preferably, the inspection station is disposed in-line upstream of the printing station.

Preferably, the inspection station further comprises: a transport mechanism for transporting the workpiece to an inspection zone.

More preferably, the transport mechanism of the inspection station comprises a belt feed unit.

Yet more preferably, the belt feed unit of the transport mechanism of the inspection station comprises first and second belt drives for engaging opposed lateral edges of the workpiece.

Still more preferably, the belt drives are configured to engage a lower surface of the workpiece.

Preferably, the imaging units comprise camera units.

In another aspect the present invention provides a method of screen printing deposits of material onto a workpiece, comprising the steps of: supporting the workpiece at an inspection zone; imaging at least two spaced features on an upper surface of the workpiece and at least two spaced features on a lower surface of the workpiece; determining a positional relationship of the imaged features on the upper and lower surfaces of the workpiece; supporting the workpiece on a workpiece support member at printing zone beneath a printing screen; imaging at least two spaced features on a lower surface of the supported workpiece at the printing zone; and moving the workpiece support member and the printing screen in relation to one another by reference to positions of the imaged features on the lower surface of the workpiece as imaged at the printing zone and the positional relationship of the imaged features on the upper and lower surfaces of the workpiece as determined at the inspection zone such as to align the upper surface of the workpiece and the printing screen in relation to one another.

Preferably, the method further comprises the steps of: imaging at least two spaced features on a lower surface of the printing screen at the printing zone; and moving the workpiece support member and the printing screen in relation to one another by reference to positions of the imaged features on the lower surface of the printing screen such as to align the workpiece support member and the printing screen in relation to one another.

Preferably, any or each step of moving the workpiece support member and the printing screen in relation to one another comprises the step of: one or both of translating and rotating at least one of the workpiece support member and the printing screen.

Preferably, the workpiece support member and the printing screen are movable in relation to one another between a workpiece-receiving configuration in which the workpiece can be received above the workpiece support member, a workpiece-alignment configuration in which the supported workpiece can be aligned relative to the printing screen, and a workpiece-clamping configuration in which the workpiece is clamped.

Preferably, any or each step of moving the workpiece support member and the printing screen in relation to one another comprises the step of: moving the workpiece support member in relation to the printing screen.

Preferably, the maximum spacing between the supported workpiece and the printing screen is less than about 20 mm.

More preferably, the spacing is less than about 10 mm.

Yet more preferably, the spacing is less than about 5 mm.

Still more preferably, the spacing is less than about 3 mm.

Yet still more preferably, the spacing is less than about 2 mm.

In a further aspect the present invention provides an inspection station for determining a positional relationship of features on upper and lower surfaces of a workpiece, comprising: an imaging system for determining a positional relationship of features on upper and lower surfaces of the workpiece, the imaging system comprising at least two spaced imaging units for imaging features on an upper surface of the workpiece, at least two spaced imaging units for imaging features on a lower surface of the workpiece, and a processing unit for determining a positional relationship of the imaged features on the upper and lower surfaces of the workpiece.

Preferably, the inspection station further comprises: a transport mechanism for transporting the workpiece to an inspection zone.

More preferably, the transport mechanism comprises a belt feed unit.

Yet more preferably, the belt feed unit comprises first and second belt drives for engaging opposed lateral edges of the workpiece.

Still more preferably, the belt drives are configured to engage a lower surface of the workpiece.

Preferably, the imaging units comprise camera units.

The present invention also extends to a screen printing apparatus incorporating the above-described inspection station.

In a yet further aspect the present invention provides a method of determining a positional relationship of features on upper and lower surfaces of a workpiece, comprising the steps of: supporting the workpiece at an inspection zone; imaging at least two spaced features on an upper surface of the workpiece and at least two spaced features on a lower surface of the workpiece; and determining a positional relationship of the imaged features on the upper and lower surfaces of the workpiece.

Preferably, the method further comprises the step of: transporting the workpiece to an inspection zone.

In yet another aspect the present invention provides a printing station for printing deposits of material onto a workpiece, comprising: a workpiece support assembly comprising a workpiece support member for supporting the workpiece at a printing zone; a printing screen disposed above the workpiece support member; a transport mechanism for transporting the workpiece to the printing zone; and an alignment system for aligning an upper surface of the supported workpiece and the printing screen in relation to one another, the alignment system comprising at least two spaced workpiece imaging units for imaging features on a lower surface of the workpiece, and an alignment stage for moving the workpiece support member and the printing screen in relation to one another such as to align the upper surface of the workpiece and the printing screen in relation to one another by reference to positions of the imaged features on the lower surface of the workpiece as imaged at the printing zone and a previously-determined positional relationship of imaged features on the upper and lower surfaces of the workpiece.

Preferably, the workpiece support member includes at least one recess for receiving at least one component on the lower surface of the workpiece.

Preferably, the workpiece support member comprises a support plate on which the workpiece is in use supported.

Preferably, the workpiece support assembly further comprises a vertical stage for raising and lowering the workpiece support member and the printing screen in relation to one another.

More preferably, the vertical stage is operable to position the workpiece support member and the printing screen in relation to one another between a workpiece-receiving configuration in which the workpiece can be received above the workpiece support member, a workpiece-alignment configuration in which the supported workpiece can be aligned relative to the printing screen, and a workpiece-clamping configuration in which the workpiece is clamped.

More preferably, the vertical stage is configured to raise and lower the workpiece support member in relation to the printing screen.

Preferably, the alignment system further comprises at least two spaced screen imaging units for imaging features on a lower surface of the printing screen, and the alignment stage is configured to align the workpiece support member and the printing screen in relation to one another by reference to the imaged features on the lower surface of the printing screen.

Preferably, the alignment stage is configured to move the workpiece support member in relation to the printing screen.

Preferably, the maximum spacing between the supported workpiece and the printing screen is less than about 20 mm.

More preferably, the spacing is less than about 10 mm.

Yet more preferably, the spacing is less than about 5 mm.

Still more preferably, the spacing is less than about 3 mm.

Still yet more preferably, the spacing is less than about 2 mm.

Preferably, the transport mechanism comprises a belt feed unit.

More preferably, the belt feed unit comprises first and second belt drives for engaging opposed lateral edges of the workpiece.

Yet more preferably, the belt drives are configured to engage a lower surface of the workpiece.

Preferably, the imaging units comprise camera units.

The present invention also extends to a screen printing apparatus incorporating the above-described printing station.

BRIEF DESCRIPTION OF THE DRAWINGS

Preferred embodiments of the present invention will now be described hereinbelow by way of example only with reference to the accompanying drawings, in which.

DETAILED DESCRIPTION OF THE INVENTION

Figure 1:
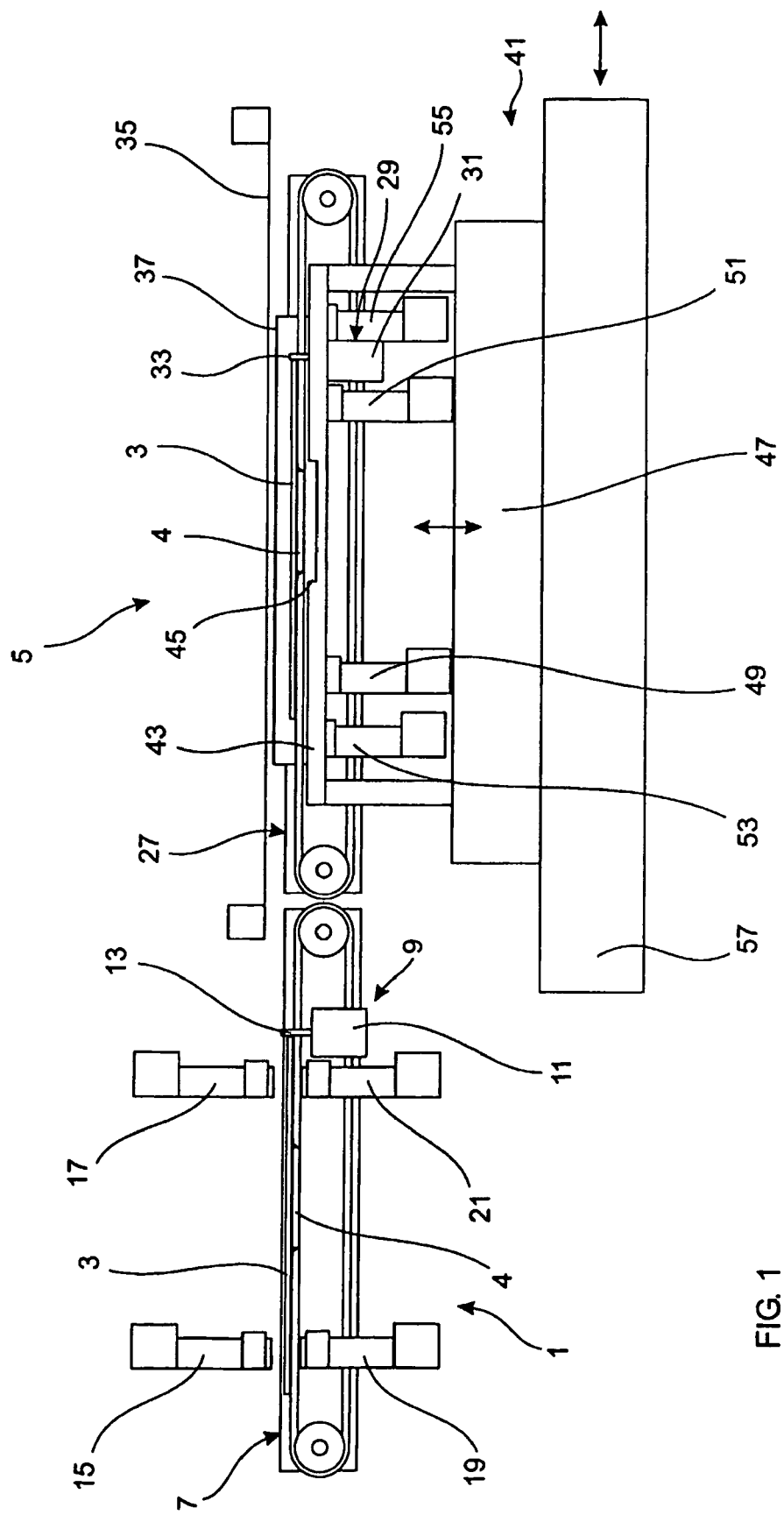
FIG. 1 illustrates a side elevational view of an inspection station and a printing station of a screen printing apparatus in accordance with preferred embodiments of the present invention.
Figure 2:
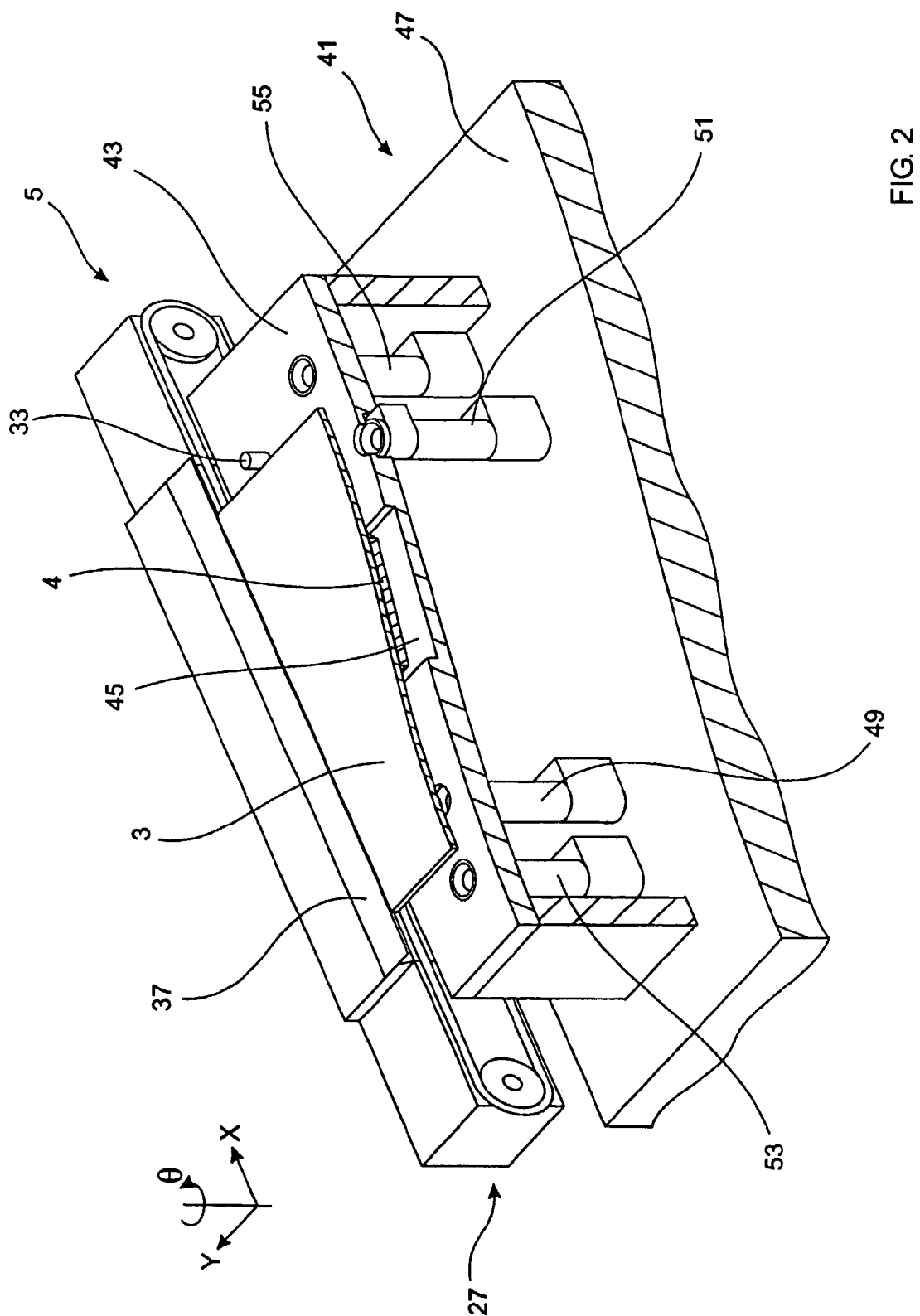
FIG. 2 illustrates in enlarged scale a partially cut-away perspective view of the printing station of FIG. 1.

The screen printing apparatus comprises an inspection station 1 to which a workpiece 3, in this embodiment a printed circuit board, having a component 4 mounted to the lower surface thereof is delivered for optical inspection, and a printing station 5, which is located downstream of the inspection station 1, to which a workpiece 3 is delivered, in this embodiment from the inspection station 1, for the printing of material deposits thereon.

The inspection station 1 comprises a transport mechanism 7 for receiving a workpiece 3 and transporting the workpiece 3 first to an inspection zone and subsequently to the printing station 5, and an inspection stop 9 for stopping a workpiece 3 at the inspection zone.

In this embodiment the transport mechanism 7 comprises a belt feed unit, as commonly used in the electronics field for transporting printed circuit boards. In a preferred embodiment, again as in this embodiment, the transport mechanism 7 comprises a pair of driven belts which engage the longitudinal edges of the workpiece 3 in the direction of transport of the workpiece 3.

In this embodiment the inspection stop 9 comprises a solenoid 11 and a pin 13 which is operated by the solenoid 11 to be moved between a first, extended position in which the pin 13 engages the workpiece 3, in this embodiment the leading edge thereof, to position the workpiece 3 at the inspection zone, and second, retracted position in which the pin 13 is free of the workpiece 3 and allows for the transfer thereof to the printing station 5.

The inspection station 1 further comprises an imaging system for determining the positional relationship of at least two spaced features, in this embodiment alignment marks, often referred to as fiducials, on both the lower and upper surfaces of the workpiece 3. In this embodiment the alignment marks are spaced in the direction of transport of the workpiece 3.

The imaging system comprises at least two, in this embodiment first and second, upper imaging units 15, 17 which are disposed in spaced relation to image the alignment marks on the upper surface of the workpiece 3. In this embodiment the upper imaging units 15, 17 comprise camera units.

The imaging system further comprises at least two, in this embodiment first and second, lower, imaging units 19, 21 which are disposed in spaced relation to image the alignment marks on the lower surface of the workpiece 3. In this embodiment the lower imaging units 19, 21 comprise camera units.

The imaging system further comprises an image processing unit (not illustrated), in this embodiment a standard personal computer, which includes image processing software for accurately locating the positions of the alignment marks as imaged by the imaging units 15, 17, 19, 21, and determining the relative positions of the alignment marks on the upper and lower surfaces of the workpiece 3. Such image processing software is commonly used in the industry; one such package being CorrectPrint™ as available from ESI of 3890 Ranchero Drive, Ann Arbor, Mich. 48108, USA.

By determining the relative positions of the alignment marks on the upper and lower surfaces of the workpiece 3 upstream of the printing station 5, the printing station 5 does not require the introduction of imaging units between the workpiece 3 and the printing screen 35, as will be described in more detail hereinbelow. In this way, as the pre-alignment image acquisition and processing is performed prior to printing, the cycle time of the printing cycle is not lengthened.

The printing station 5 comprises a transport mechanism 27 for receiving a workpiece 3, in this embodiment from the inspection station 1, and transporting the workpiece 3 first to a printing zone and subsequently to apparatus downstream thereof, and a printing stop 29 for stopping a workpiece 3 at the printing zone.

In this embodiment the transport mechanism 27 comprises a belt feed unit, as commonly used in the electronics field for transporting printed circuit boards. In a preferred embodiment, again as in this embodiment, the transport mechanism 27 comprises a pair of driven belts which engage the longitudinal edges of the workpiece 3 in the direction of transport of the workpiece 3.

In this embodiment the printing stop 29 comprises a solenoid 31 and a pin 33 which is operated by the solenoid 31 to be moved between a first, extended position in which the pin 33 engages the workpiece 3, in this embodiment the leading edge thereof, to position the workpiece 3 at the printing zone, and a second, retracted position in which the pin 33 is free of the workpiece 3 and allows for the transfer thereof to downstream apparatus.

The printing station 5 further comprises a printing screen 35 which includes a plurality of apertures through which material is deposited onto a workpiece 3 located at the printing zone therebeneath.

The printing station 5 further comprises a clamping member 37, in this embodiment comprising first and second shims disposed laterally of the transport path of the workpieces 3, to which a workpiece 3 is clamped when aligned in the printing zone.

The printing station 5 further comprises a workpiece support assembly 41 for supporting a workpiece 3 at the printing zone beneath the printing screen 35.

The workpiece support assembly 41 comprises a workpiece support member 43, in this embodiment a tooling support plate, for supporting the workpiece 3 at the printing zone. In this embodiment the workpiece support member 43 includes a recess 45 in an upper surface thereof for accommodating the component 4 on the lower surface of the workpiece 3.

The workpiece support assembly 41 further comprises a vertical stage 47 which is attached to the workpiece support member 43 and configured to raise and lower the workpiece support member 43 between a lower, workpiece-receiving position in which a workpiece 3 can be transported to the printing zone thereabove by the transport mechanism 27, an intermediate, workpiece-alignment position in which a workpiece 3 is supported by the workpiece support member 43 and can be aligned relative to the printing screen 35, and an upper, workpiece-clamping position in which a workpiece 3 is clamped to the clamping member 37. In this embodiment the space between the upper surface of the workpiece 3 and the lower surface of the printing screen 35 is less than about 3 mm.

The printing station 5 further comprises an alignment system for aligning a workpiece 3 on the workpiece support member 43 relative to the printing screen 35.

The alignment system comprises first and second workpiece imaging units 49, 51 which are disposed in spaced relation to the workpiece support member 43 to image features, in this embodiment alignment marks, on the lower surface of the workpiece 3. In this embodiment the workpiece imaging units 49, 51 are configured to image the same alignment marks on the lower surface of the workpiece 3 as the lower imaging units 19, 21 in the inspection station 1. In this embodiment the workpiece imaging units 49, 51 comprise camera units.

The alignment system further comprises first and second screen imaging units 53, 55 which are disposed in spaced relation to the workpiece support member 43 to image features, in this embodiment alignment marks, on the lower surface of the printing screen 35. In this embodiment the screen imaging units 53, 55 comprise camera units. The screen imaging units 53, 55 provide for monitoring of the alignment between the workpiece support member 43 and the printing screen 35, thereby enabling correction of any misalignment of the workpiece support member 43 and the printing screen 35. Although the relative positions of the workpiece support member 43 and the printing screen 35 should in theory be fixed, misalignment caused by relative movement of the printing screen 35 and the workpiece support member 43 can occur, for example, as a result of thermal effects or wear.

The alignment system further comprises an alignment stage 57 for translating the workpiece support member 43 in the X, Y plane and rotating the workpiece support member 43 about the θ axis.

The alignment system further comprises a processing unit (not illustrated), in this embodiment a standard personal computer, which includes image processing software for accurately locating the positions of the alignment marks as imaged by the workpiece and screen imaging units 49, 51, 53, 55, and alignment software for aligning the workpiece 3 with the printing screen 35 by reference to the imaged positions of the alignment marks on the workpiece 3 and the alignment marks on the printing screen 35.

In this embodiment each of the camera units comprises an illuminator for projecting a light beam onto the respective alignment mark and a small region therearound, a lens arrangement for focussing an image of the alignment mark, and an electronic camera which includes a sensing element for receiving the focussed image.

In one embodiment the imaging units 49, 51, 53, 55 and the printing stop 29 are mounted to the workpiece support member 43 such as to provide a single, integral assembly which allows for easy replacement with another such assembly which is configured for another, different workpiece 3.

In another embodiment the workpiece support member 43 is detachable to allow for easy replacement with another workpiece support member 43 which is configured for a different workpiece 3, and the imaging units 49, 51, 53, 55 and the printing stop 29 are detachable from the workpiece support member 43 such as to enable re-attachment to the other workpiece support member 43.

In operation, a workpiece 3 is delivered to the inspection station 1 and transported by the transport mechanism 7 thereof to the inspection zone. The workpiece 3 is stopped in the inspection zone by the inspection stop 9, in this embodiment by engagement with the pin 13 of the inspection stop 9.

With the workpiece 3 located at the inspection zone, the imaging system, through the upper and lower imaging units 15, 17, 19, 21 and the processing unit, acts to acquire images of the at least two alignment marks on both the upper and lower surfaces of the workpiece 3, and, from this image data, determine the positional relationship between the alignment marks on the upper and lower surfaces of the workpiece 3. As will be described in more detail hereinbelow, the determination of this positional relationship enables the subsequent alignment of the upper surface of the workpiece 3 accurately with the printing screen 35 by only imaging alignment marks on the lower surface of the workpiece 3.

The workpiece 3 is then transported by the transport mechanism 7 of the inspection station 1 to the printing station 5, and the inspection station 1 is then in a condition ready to receive a further workpiece 3.

Figure 3:
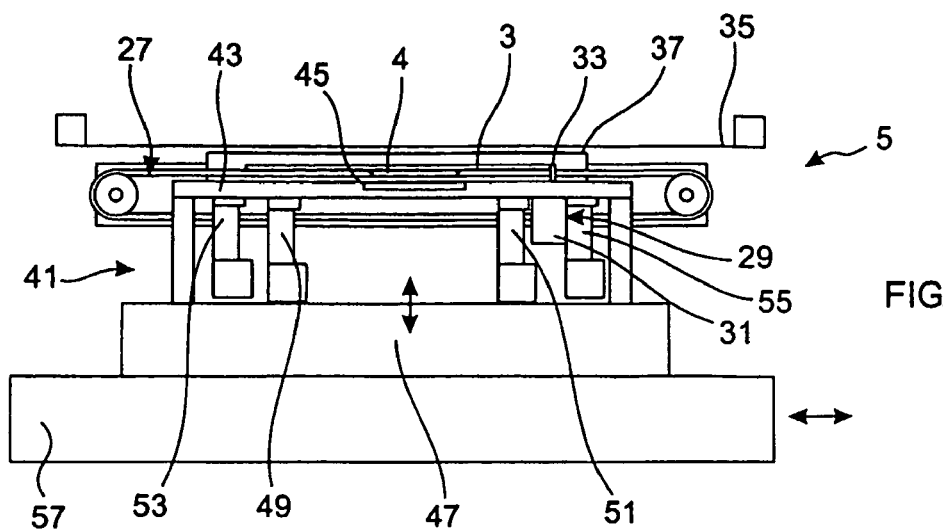
FIG. 3 illustrates a side elevational view of the printing station of FIG. 1 in a first, workpiece-receiving configuration.

When delivered to the printing station 5, and with the workpiece support member 43 in the lower, workpiece-receiving position, the workpiece 3 is transported by the transport mechanism 27 of the printing station 5 to the printing zone, as illustrated in FIG. 3. The workpiece 3 is stopped in the printing zone by the printing stop 29, in this embodiment by engagement with the pin 33 of the printing stop 29.

Figure 4:
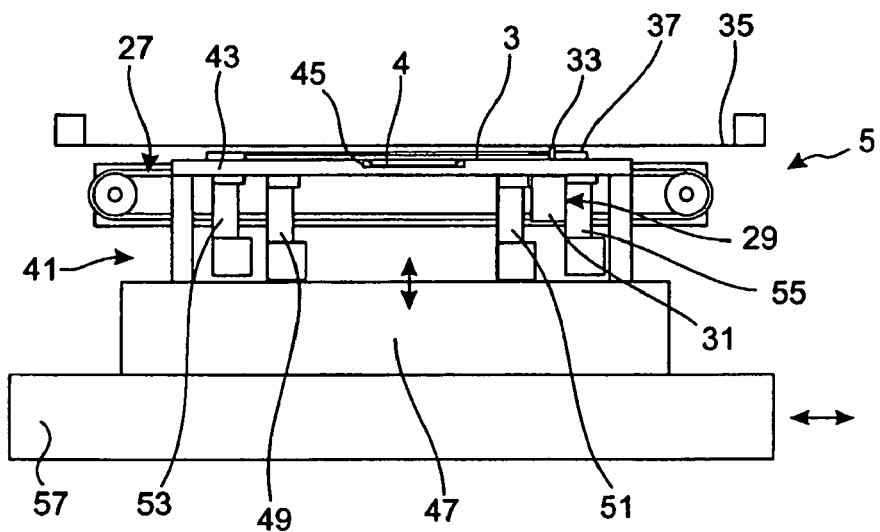
FIG. 4 illustrates a side elevational view of the printing station of FIG. 1 in a second, workpiece-alignment configuration.

With the workpiece 3 located at the printing zone, the workpiece support member 43 is raised by the vertical stage 47 to the intermediate, workpiece-alignment position, as illustrated in FIG. 4, at which position the workpiece 3 is supported by the workpiece support member 43 and the workpiece 3 is raised from the transport mechanism 27 of the printing station 5.

Under the control of the alignment system, the workpiece imaging units 49, 51 acquire images of alignment marks on the lower surface of the workpiece 3 and the screen imaging units 53, 55 acquire images of alignment marks on the lower surface of the printing screen 35. From this image data, and the previously-determined positional relationship between alignment marks on the upper and lower surfaces of the workpiece 3 as obtained by the inspection station 1, the upper surface of the workpiece 3 can be accurately aligned with the printing screen 35 by referencing the positions of the alignment marks on the lower surface of the printing screen 35 to the alignment marks on the lower surface of the workpiece 3. In this embodiment the lower imaging units 19, 21 of the inspection station 1 and the workpiece imaging units 49, 51 of the printing station 5 are configured to image the same alignment marks, but it will be understood that different alignment marks could be imaged provided that the positional relationship between the alignment marks is known.

As described hereinabove, the positional relationship between the alignment marks on the upper and lower surfaces of the workpiece 3 is determined by the inspection station 1. Thus, in the printing station 5, from a determination alone of the positions of the alignment marks on the lower surface of the workpiece 3 by the workpiece imaging units 49, 51, the upper surface of the workpiece 3 can be accurately aligned with the printing screen 35.

With the positions of the alignment marks on the lower surface of the workpiece 3 and the lower surface of the printing screen 35 determined, the alignment stage 57 is operated to translate the workpiece support member 43 in the X, Y plane and rotate the workpiece support member 43 about the θ axis in order to achieve the required alignment between the upper surface of the workpiece 3 and the printing screen 35.

Figure 5:
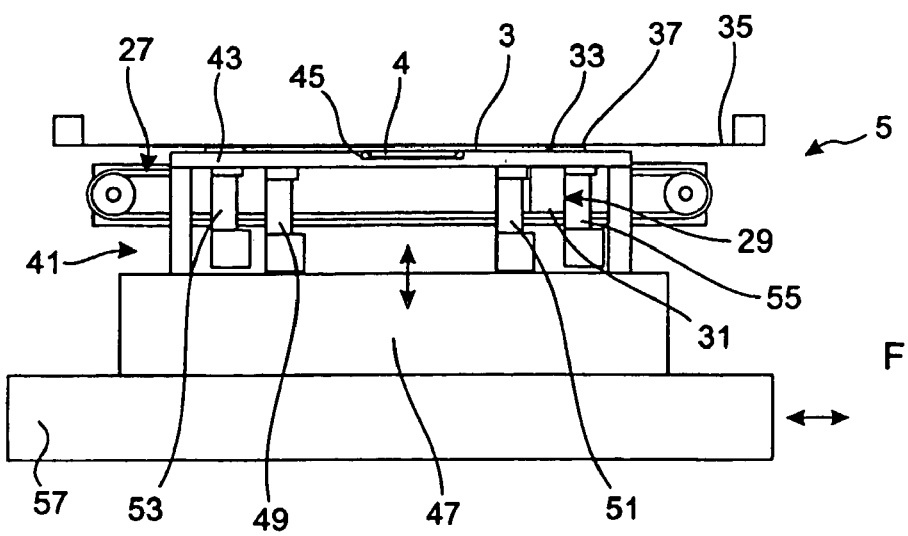
FIG. 5 illustrates a side elevational view of the printing station of FIG. 1 in a third, workpiece-printing configuration.

When so aligned, the solenoid 31 of the printing stop 29 is actuated to retract the pin 33 thereof to the retracted position, and the vertical stage 47 is then operated first to clamp the workpiece 3 to the workpiece clamping member 37 and then position the workpiece 3 in a position ready for printing, as illustrated in FIG. 5. In this embodiment, by additionally referencing to positions on the lower surface of the printing screen 35, any misalignment between the workpiece 3 and the printing screen 35 can be determined, and, if required, accommodated.

With the workpiece 3 clamped, a print head (not illustrated) acts on the upper surface of the printing screen 35 to deposit material onto the workpiece 3.

When printing has been completed, the workpiece support member 43 is then lowered by the vertical stage 47 to the lower, workpiece-receiving position, in which position the workpiece 3 is returned to the transport mechanism 27 of the printing station 5.

The workpiece 3 is then transported by the transport mechanism 27 of the printing station 5 to apparatus downstream thereof, and the solenoid 31 of the printing stop 29 is then actuated to extend the pin 33 thereof to the extended position. The printing station 5 is then in a condition ready to receive a further workpiece 3 for printing.

Finally, it will be understood that the present invention has been described in its preferred embodiments and can be modified in many different ways without departing from the scope of the invention as defined by the appended claims.

In one alternative embodiment the first and second screen imaging units 53, 55 can be omitted, with alignment marks on the lower surface of the printing screen 35 being imaged by the first and second workpiece imaging units 49, 51 prior to a workpiece 3 being transported to the printing zone.

In another alternative embodiment the first and second screen imaging units 53, 55 can be omitted, with the relative positions of the printing screen 35 and the workpiece support member 43 being determined instead from the registration of the printing screen 35 and the alignment stage 57.

In this embodiment the workpiece support member 43 is moved in relation to the printing screen 35 to vertically position a supported workpiece 3 and the printing screen 35 in relation to one another. In alternative embodiments the printing screen 35 could be moved in relation to the workpiece support member 43, or both the printing screen 35 and the workpiece support member 43 could be moved.

In this embodiment the workpiece support member 43 is translated in the X, Y plane and rotated about the θ axis in relation to the printing screen 35 to align the upper surface of a supported workpiece 3 and the printing screen 35 in relation to one another. In alternative embodiments the printing screen 35 could be translated in the X, Y plane and rotated about the θ axis in relation to the workpiece support member 43, or both the printing screen 35 and the workpiece support member 43 could be translated in the X, Y plane and rotated about the θ axis.

The invention claimed is:

1. A screen printing apparatus for printing deposits of material onto a workpiece, comprising:
an inspection station for determining a positional relationship of features on upper and lower surfaces of the workpiece at an inspection zone, the inspection station comprising: an imaging system for determining a positional relationship of features on upper and lower surfaces of the workpiece, the imaging system comprising at least two spaced imaging units for imaging features on an upper surface of the workpiece, at least two spaced imaging units for imaging features on a lower surface of the workpiece, and a processing unit for determining a positional relationship of the imaged features on the upper and lower surfaces of the workpiece; and
a printing station for printing deposits of material onto the workpiece, the printing station comprising: a workpiece support assembly comprising a workpiece support member for supporting the workpiece at a printing zone; a printing screen disposed above the workpiece support member; a transport mechanism for transporting the workpiece to the printing zone; and an alignment system for aligning the upper surface of the supported workpiece and the printing screen in relation to one another, the alignment system comprising at least two spaced workpiece imaging units for imaging features on a lower surface of the workpiece, and an alignment stage for moving the workpiece support member and the printing screen in relation to one another such as to align the upper surface of the workpiece and the printing screen in relation to one another by reference to positions of the imaged features on the lower surface of the workpiece as imaged at the printing zone and the positional relationship of the imaged features on the upper and lower surfaces of the workpiece as determined at the inspection zone.

2. The apparatus of claim 1, wherein the workpiece support member includes at least one recess for receiving at least one component on the lower surface of the workpiece.

3. The apparatus of claim 1, wherein the workpiece support member comprises a support plate on which the workpiece is in use supported.

4. The apparatus of claim 1, wherein the workpiece support assembly further comprises a vertical stage for raising and lowering the workpiece support member and the printing screen in relation to one another.

5. The apparatus of claim 4, wherein the vertical stage is operable to position the workpiece support member and the printing screen in relation to one another between a workpiece-receiving configuration in which the workpiece can be received above the workpiece support member, a workpiece-alignment configuration in which the supported workpiece can be aligned relative to the printing screen, and a workpiece-clamping configuration in which the workpiece is clamped.

6. The apparatus of claim 4, wherein the vertical stage is configured to raise and lower the workpiece support member in relation to the printing screen.

7. The apparatus of claim 1, wherein the alignment system further comprises at least two spaced screen imaging units for imaging features on a lower surface of the printing screen, and the alignment stage is configured to align the workpiece support member and the printing screen in relation to one another by reference to positions of the imaged features on the lower surface of the printing screen.

8. The apparatus of claim 1, wherein the alignment stage is configured to move the workpiece support member in relation to the printing screen.

9. The apparatus of claim 1, wherein the maximum spacing between the supported workpiece and the printing screen is less than about 20 mm.

10. The apparatus of claim 9, wherein the spacing is less than about 10 mm.

11. The apparatus of claim 10, wherein the spacing is less than about 5 mm.

12. The apparatus of claim 11, wherein the spacing is less than about 3 mm.

13. The apparatus of claim 12, wherein the spacing is less than about 2 mm.

14. The apparatus of claim 1, wherein the transport mechanism of the printing station comprises a belt feed unit.

15. The apparatus of claim 14, wherein the belt feed unit of the transport mechanism of the printing station comprises first and second belt drives for engaging opposed lateral edges of the workpiece.

16. The apparatus of claim 15, wherein the belt drives are configured to engage a lower surface of the workpiece.

17. The apparatus of claim 1, wherein the inspection station is disposed in-line upstream of the printing station.

18. The apparatus of claim 1, wherein the inspection station further comprises: a transport mechanism for transporting the workpiece to the inspection zone.

19. The apparatus of claim 18, wherein the transport mechanism of the inspection station comprises a belt feed unit.

20. The apparatus of claim 19, wherein the belt feed unit of the transport mechanism of the inspection station comprises first and second belt drives for engaging opposed lateral edges of the workpiece.

21. The apparatus of claim 20, wherein the belt drives are configured to engage a lower surface of the workpiece.

22. The apparatus of claim 1, wherein the imaging units comprise camera units.

23. A method of screen printing deposits of material onto a workpiece, comprising the steps of:
supporting the workpiece at an inspection zone;
imaging at least two spaced features on an upper surface of the workpiece and at least two spaced features on a lower surface of the workpiece;
determining a positional relationship of the imaged features on the upper and lower surfaces of the workpiece;
supporting the workpiece on a workpiece support member at printing zone beneath a printing screen;
imaging at least two spaced features on a lower surface of the supported workpiece at the printing zone; and
moving the workpiece support member and the printing screen in relation to one another by reference to positions of the imaged features on the lower surface of the workpiece as imaged at the printing zone and the positional relationship of the imaged features on the upper and lower surfaces of the workpiece as determined at the inspection zone such as to align the upper surface of the workpiece and the printing screen in relation to one another.

24. The method of claim 23, further comprising the steps of:

imaging at least two spaced features on a lower surface of the printing screen at the printing zone; and moving the workpiece support member and the printing screen in relation to one another by reference to the imaged features on the lower surface of the printing screen such as to align the workpiece support member and the printing screen in relation to one another.

25. The method of claim 23, wherein any or each step of moving the workpiece support member and the printing screen in relation to one another comprises the step of:

one or both of translating and rotating at least one of the workpiece support member and the printing screen.

26. The method of claim 23, wherein the workpiece support member and the printing screen are movable in relation to one another between a workpiece-receiving configuration in which the workpiece can be received above the workpiece support member, a workpiece-alignment configuration in which the supported workpiece can be aligned relative to the printing screen, and a workpiece-clamping configuration in which the workpiece is clamped.

27. The method of claim 23, wherein any or each step of moving the workpiece support member and the printing screen in relation to one another comprises the step of:

moving the workpiece support member in relation to the printing screen.

28. The method of claim 23, wherein the maximum spacing between the supported workpiece and the printing screen is less than about 20 mm.

29. The method of claim 28, wherein the spacing is less than about 10 mm.

30. The method of claim 29, wherein the spacing is less than about 5 mm.

31. The method of claim 30, wherein the spacing is less than about 3 mm.

32. The method of claim 31, wherein the spacing is less than about 2 mm.

* * * * *